United States Patent [19]
Sumi

[11] Patent Number: 5,270,981
[45] Date of Patent: Dec. 14, 1993

[54] FIELD MEMORY DEVICE FUNCTIONING AS A VARIABLE STAGE SHIFT REGISTER WITH GATED FEEDBACK FROM ITS OUTPUT TO ITS INPUT

[75] Inventor: Masahiko Sumi, Chigasaki, Japan
[73] Assignee: Kabushiki Kaisha Toshiba, Kawasaki, Japan
[21] Appl. No.: 664,477
[22] Filed: Mar. 4, 1991

Related U.S. Application Data

[60] Division of Ser. No. 373,703, Jul. 3, 1989, abandoned, which is a continuation of Ser. No. 890,373, Jul. 29, 1986, abandoned.

[30] Foreign Application Priority Data

Jul. 30, 1985 [JP] Japan .................................. 60-168027

[51] Int. Cl.$^5$ ........................ G11C 19/00; G11C 21/00
[52] U.S. Cl. ........................... 365/221; 365/73; 365/236; 365/240; 377/72; 345/200
[58] Field of Search ................... 365/73, 189.12, 239, 365/240, 236, 78, 230.09, 189.04, 221; 340/799, 800; 377/70, 72, 73

[56] References Cited

U.S. PATENT DOCUMENTS

| | | | |
|---|---|---|---|
| 3,972,031 | 7/1976 | Riemenschneider et al. | 365/73 |
| 3,983,380 | 9/1976 | Sharif et al. | 364/737 |
| 4,297,567 | 10/1981 | Herzner | 365/73 |
| 4,322,827 | 3/1982 | Weber | 365/236 |
| 4,395,764 | 7/1983 | Matsue | 365/189 |
| 4,433,394 | 2/1984 | Torii et al. | 365/221 |
| 4,481,608 | 11/1984 | Berkowitz | 365/73 |
| 4,509,142 | 4/1985 | Childers | 395/425 |
| 4,539,657 | 9/1985 | Nicholls | 365/73 |
| 4,592,019 | 5/1986 | Huang et al. | 365/189 |
| 4,618,947 | 10/1986 | Tran et al. | 365/230.08 |
| 4,633,441 | 12/1986 | Ishimoto | 365/219 |
| 4,639,894 | 1/1987 | Ishii | 365/189 |
| 4,740,922 | 4/1988 | Ogawa | 365/238 |
| 4,787,065 | 11/1988 | Barazesh | 364/900 |

FOREIGN PATENT DOCUMENTS

| | | |
|---|---|---|
| 0155731 | 9/1985 | European Pat. Off. . |
| 0102941 | 8/1979 | Japan ........... 365/73 |
| 0049073 | 4/1980 | Japan ........... 365/233 |
| 2071372 | 9/1981 | United Kingdom ...... 365/236 |

OTHER PUBLICATIONS

Gully, David W. "Joining Text and Graphics Enhances Video Performance", Computer Design, Aug. 1984, pp. 121-129.

Primary Examiner—Glenn Gossage
Attorney, Agent, or Firm—Foley & Lardner

[57] ABSTRACT

A memory device having an addressing unit for addressing different values as addresses for input/output of data for each clock input during one cycle, and a memory inputting data at different designated addresses and cyclically outputting stored data. The memory device provides the operation of a shift register which is capable of determining the number of stages in accordance with the content of the addressing. By employing a memory which effects read-modify-write operations and by delivering input data obtained by the feedback of output data to this memory, the memory device can repeatedly output the same data. The memory device has a switch circuit operative in a first position for connecting an output of the memory to an input of the memory and in a second position for connecting the input of the memory to an external data source.

6 Claims, 8 Drawing Sheets

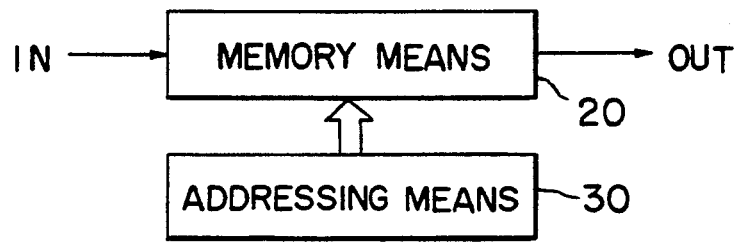
F I G. 2
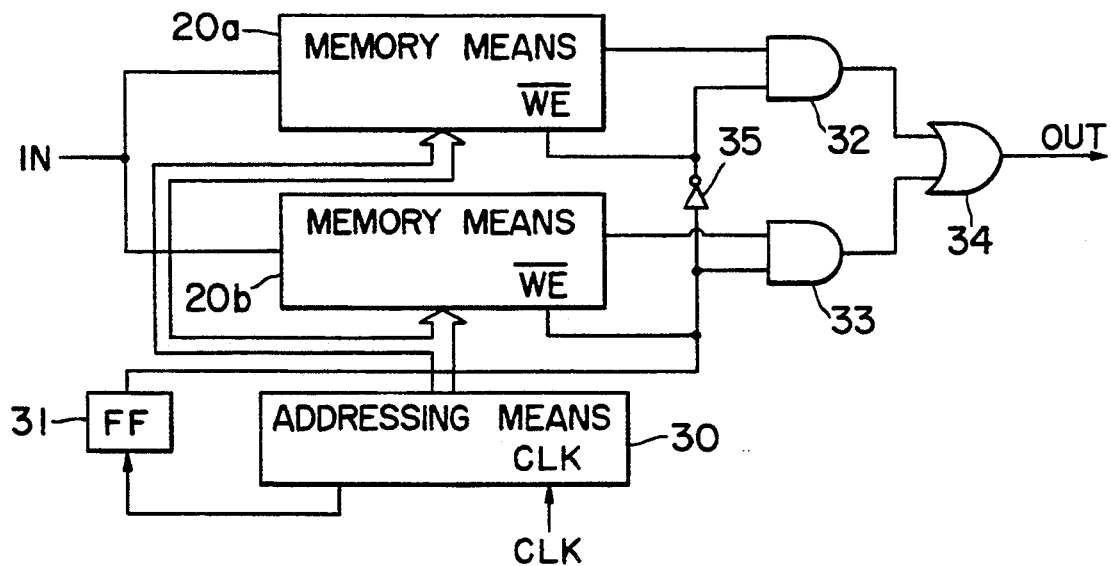
F I G. 4

FIELD MEMORY DEVICE FUNCTIONING AS A VARIABLE STAGE SHIFT REGISTER WITH GATED FEEDBACK FROM ITS OUTPUT TO ITS INPUT

This application is a divisional of application Ser. No. 07/373,703, filed July 3, 1989, now abandoned, which is a continuation of application Ser. No. 06/890,373 filed July 29, 1986, now abandoned.

BACKGROUND OF THE INVENTION

The present invention relates to a memory device, and more particularly to a memory device basically identical to that of a shift register having a depth of variable stage.

Shift registers comprising a plurality of registers cascade-connected to shift their contents in sequence play an important role in computational processings or image processings, etc. Products having various capacities of 4, 8, 16, 1024 and 64K bits, etc. have been available.

Referring to FIG. 1, there is shown an example of a commonly used conventional shift register 10 of 8 bit configuration. This shift register 10 comprises eight stages of flip-flops 1 to 8 wherein Q outputs of the flip-flops are respectively connected to D inputs of the next stages thereof and a clock line is commonly connected to the respective flip-flops.

With the shift register thus configured, when a clock pulse signal is input from the clock line CLK, data input to the leftmost flip-flop 1 is transferred to the right per each clock pulse and output data is fetched from an output terminal OUT 1 of the rightmost flip-flop 8.

To change the number of stages in the shift register 10 of the eight stages, as shown in FIG. 1, a method has been employed to provide lead-out or draw-out lines on the output sides of the respective stages of the flip-flops to switch the lead-out lines by using a changeover switch 9 to fetch an output delivered through the selected lead-out line from an output terminal OUT 2 to the external.

When the shift register has a small number of stages as in the above-mentioned example, this method is satisfactory, but when the shift register has a large number of stages, its realization is impossible in an actual sense.

For instance, when characters or figures (graphic pattern) are displayed on a CRT using a display device, there is employed a method to store display information in a storage unit to use the information read for a required display. When there is no change in information corresponding to one frame (frame information), it is convenient to repeatedly read the display information at a rate of 60 per second. Generally, a volume of such an information corresponding to one frame is not necessarily expressed by the second power (power of 2) and the frame information requires a large capacity. Hitherto, for storing such a frame information, it was necessary to specially provide a storage unit having a required memory capacity, resulting in high cost of the device. In addition, in the case of the above-mentioned example, since all of the memory capacity of the second power are not used, there occurs a wasteful memory capacity and an operation for combining valid or effective informations with each other is required.

SUMMARY OF THE INVENTION

An object of the present invention is to provide a memory device having an arbitrary number of stages.

Another object of the present invention is to provide a memory device having an arbitrary number of stages and capable of outputting the same value every single-cyclic clock signal.

A further object of the present invention is to provide a memory device having an arbitrary number of stages and capable of changing memory contents according to need.

A still further object of the present invention is to provide a memory device having an arbitrary depth of 2N stages using a double-cyclic N clock signal.

To achieve these objects, as one aspect of the present invention, there is provided a memory device comprising addressing means for cyclically designating different values as addresses for input and output of data per each clock input during one cycle, and memory means having a capacity of plural bits, the memory means cyclically inputting data at different addresses designated by the addressing means or cyclically outputting data from the different addresses designated.

As another aspect of the present invention, there is provided a memory device comprising addressing means for cyclically designating different values as addresses for input and output of data per each clock input during one cycle, and memory means having a capacity of plural bits, the memory means cyclically outputting data stored at different addresses designated by the addressing means, and at the same time, cyclically writing new data at the different addresses designated, data output from the memory means being fed back to the input side of the memory means.

As a further aspect of the present invention, there is provided a memory device comprising addressing means for cyclically designating different values as addresses for input and output of data per each clock input of a single-cyclic clock signal, a flip-flop responsive to the completion of acknowledgement of the single-cyclic clock signal to invert its state, and two memory means each having a capacity of plural bits, the two memory means having a common data input, different addresses designated by the addressing means being used as a common address input, the two memory means cyclically inputting data at the different addresses designated or cyclically outputting data from the different addresses designated, the two memory means being such that one is in a read state while the other is in a write state in response to a designation from the flip-flop.

BRIEF DESCRIPTION OF THE DRAWINGS

In the accompanying drawings:

FIG. 2 is a block diagram showing a basic concept of a memory device according to the present invention;

FIGS. 3, 3A and 3B are circuit diagrams illustrating modified embodiments based on the configuration shown in FIG. 2;

FIGS. 4 and 4A are circuit diagrams illustrating modified embodiments based on the configuration shown in FIG. 2.

DETAILED DESCRIPTION OF THE INVENTION

Figure 1:
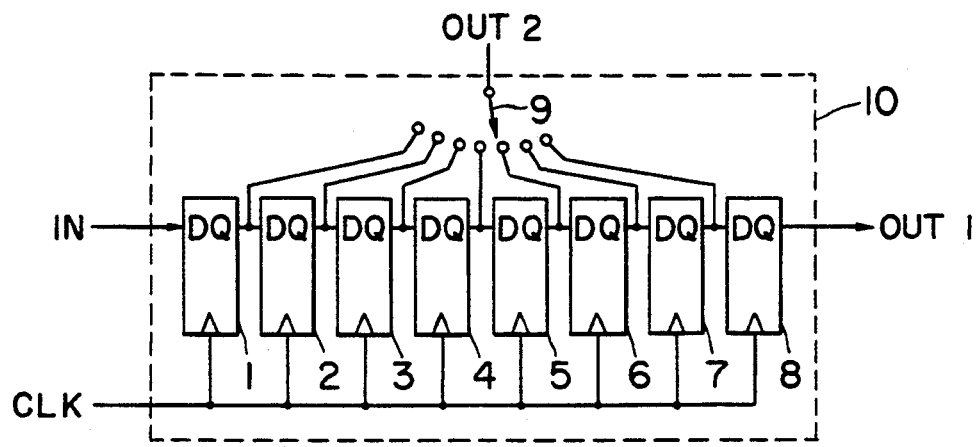
FIG. 1 is a schematic view illustrating a conventional shift register.

The present invention will be described in detail in connection with preferred embodiments with reference to attached drawings.

Initially, referring to FIG. 2, there is shown, in a block form, a basic concept of a memory device according to the present invention. The memory device shown is configured so that addresses of a memory means 20 for storing input data therein are designated by an addressing means 30, thus effecting write and read operations of data. This addressing means 30 has a function to cyclically designate addresses of the memory means 20 so that the same value of the address is not designated during one cycle. For instance, when the number of addresses is equal to N, the addressing means 30 functions as a mod-N counter (defined as a counter having N stages in the positional notation) which is decremented by one for each clock pulse to return to the value of $n=N-1$ for a second time when the count value is equal to zero. The memory means 20 has a function to store data into a memory area assigned to an address designated by the addressing means 30 and/or read the data therefrom. For the memory means 20, e.g., a dynamic RAM of 64K bit configuration may be used.

The memory device thus configured operates as follows. First, an address is designated by using the addressing means 30 to store data into a memory area assigned to the designated address. In the next step, by allowing the addressing means 30 to circulate so as to designate the same address in the same order, data is read from the concerned memory area, thus making it possible to fetch the same data previously stored therefrom. Thus, the memory device functions as a shift register.

FIG. 3 is a circuit diagram illustrating an embodiment based on the configuration shown in FIG. 2. This memory device comprises a RAM 40, a counter 50 for designating write and read addresses of the RAM 40 one by one per each clock pulse, a shift register 60 for setting an initial value n to the counter, a control circuit 70 for effecting control of the entirety of the memory circuit, and a selector 80.

In this embodiment, the RAM 40 is comprised of a dynamic RAM of 64K bit configuration. The RAM 40 is provided with 16 address lines, thus making it possible to write data into a memory area assigned to an address determined by the selection of the address lines or read it from the memory area assigned to the address. To perform this function, the RAM 40 is provided with a write enable (WE) terminal, a data input ($D_{in}$) terminal and a data output ($D_{out}$) terminal.

The counter 50 counts down one by one per each clock pulse from a designated initial value n less than $(2^{16}-1)$. After the count value reaches zero, the counter 50 repeatedly counts, down from the initial value of n. In this counter 50, the initial value of n is determined by 16 set inputs.

The shift register 60 is configured as a sixteen stage shift register for setting the value of n wherein outputs of their stages are set inputs of the counter, respectively.

The control circuit 70 is comprised of an AND gate to which a clock (CLK) signal and shift enable (SFTE) signal are input. An output of the control circuit 70 is input to a CLK terminal of the shift register 60, a CLK terminal of the counter 50 and a WE (write enable) terminal of the RAM 40. When the SFTE signal is at high level, the CLK signal is delivered to the above-mentioned circuit components from the control circuit 70.

The selector 80 comprises an AND gate 81 to which a $D_{out}$ output of the RAM 40 and a signal obtained by inverting an initialization (INIT) signal using an inverter 84 are input, an AND gate 82 to which the INIT signal and an output of the shift register 60 are input, and an OR gate to which outputs from the two AND gates are input. An output of the OR gate 83 is output as an output of the entire circuit. The INIT signal is also input to a LOAD terminal of the counter 50.

FIG. 4 is a circuit diagram illustrating another embodiment obtained by improving the configuration shown in FIG. 2.

In this embodiment, the memory device comprises two memory means 20a and 20b subject to addressing by a common addressing means represented by the same reference numeral 30 as in the circuit shown in FIG. 2. The memory device further comprises a flip-flop 31 which inverts its state when a designated value becomes zero in response to the completion of a single-cyclic clock signal. An output signal of the flip-flop 31 is delivered to a write enable (WE) terminal of the memory means 20a through an inverter 35 and is directly delivered to a write enable (WE) terminal of the memory means 20b so that signals delivered to the WE terminals of the memory means 20a and 20b are opposite to each other in their logical states. To the memory means 20a and 20b, data is commonly input. An output of the memory means 20a and an inverted signal of the output signal from the flip-flop 31 are input to an AND gate 32. An output of the memory means 20b and the output signal from the flip-flop 31 are input to an AND gate 33. Two outputs of the AND gates 32 and 33 are input to an OR gate 34. Thus, output data is output from memory means placed in the write-disabled state in accordance with the function given by the circuit comprising the inverter 35, the AND gates 32 and 33 and the OR gate 34.

The operation of the embodiment shown in FIG. 4 will be described below.

Assuming now that the output of the flip-flop 31 represents logical "1" in an initial state, the memory means 20b is in write-disabled state and the memory means 20a is in write enabled state. When an address is designated by the addressing means 30, data is read from the memory means 20b one by one per each clock pulse and the data thus read is output through the AND gate 33 and the OR gate 34. At this time, data is written into a memory area assigned to a designated address of the memory means 20a. The output of the memory means 20a is disallowed because the AND gate 32 is in disable state.

Subsequently, when the address designation value is successively decremented and then reaches to zero, the address designation value becomes equal to $N-1$ for a second time and at the same time an output of the flip-flop 31 is inverted so that its logical state becomes "0".

As a result, data is read from the memory means 20a and data is written into the memory means 20b.

This embodiment can eliminate the possibility of discontinuity of data which would occur in the embodiment shown in FIG. 2 and realize substantially the same memory device as a 2N state shift register.

Figure 5:
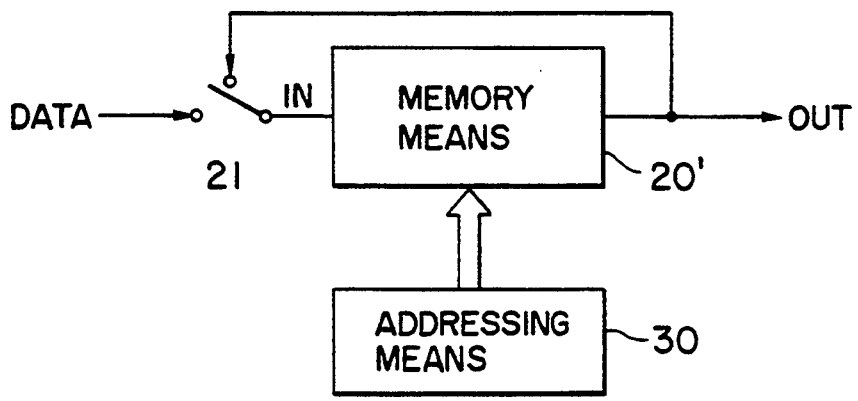
FIG. 5 is a block diagram showing another concept of a memory device according to the present invention wherein the memory device has a function to repeatedly read the same data.

Referring to FIG. 5, there is shown a further embodiment of a memory device according to the present invention wherein memory means represented by reference numeral 20' and the addressing means 30 are provided in the same manner as in the configuration shown in FIG. 2. In this embodiment, the addressing means 30 is basically identical to that in the configuration shown in FIG. 2, but the memory means 20' differs from that in the latter in that it has a function to write data while reading it, i.e., effect so-called read modify write operation. An output of the memory means 20' is fetched therefrom and at the same time the output is fed back to the input side of the memory means 20' to again input the output thus fed back to the memory means through a switch means 21. The switch means 21 may be comprised of e.g. a gate circuit for selecting a new data input or a re-input of memory contents.

In the memory device thus configured, by allowing the addressing means 30 to cyclically designate the same value in the same order during each cycle and by setting the switch means 21 so as to rewrite an output of the memory means 20', it is possible to repeatedly fetch a series of the same data per each cycle. Further, by changing the number of addresses assigned to memory areas in the memory means 20' designated by the addressing means 30, the memory device in this embodiment can function as a shift register having an arbitrary number of stages. In addition, when the switch means 21 is set to the DATA input, the memory device in this embodiment has substantially the same configuration and operation as in the device shown in FIG. 1.

Figure 6:
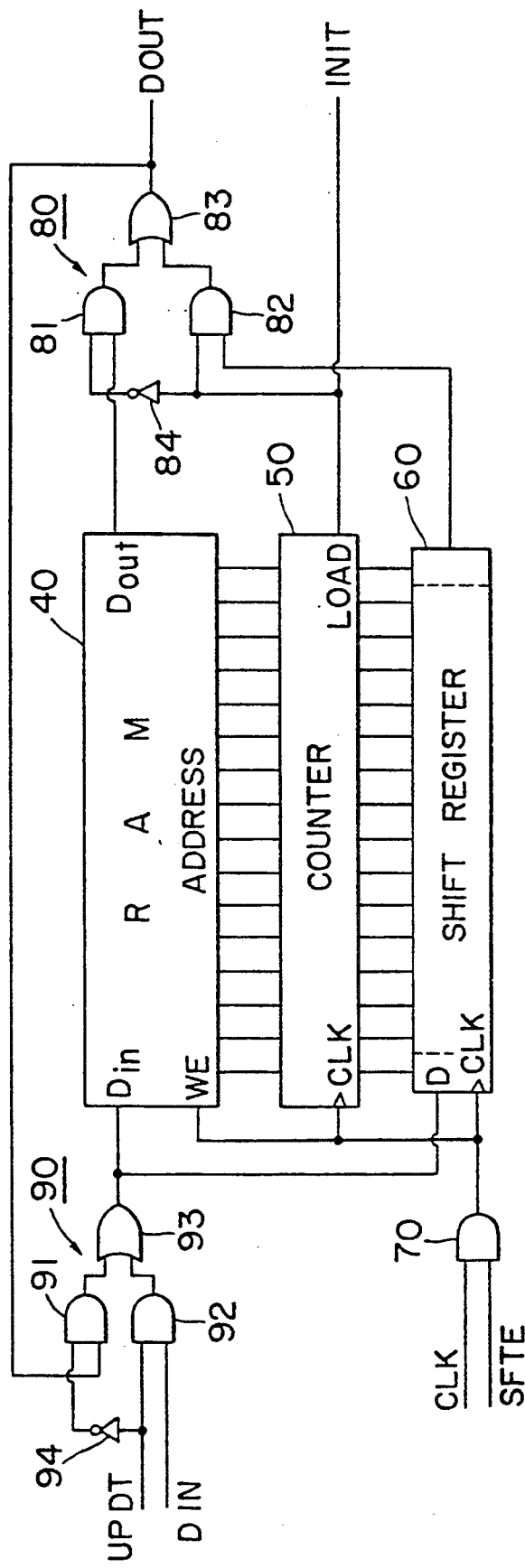
FIGS. 6A and 6B are circuit diagrams illustrating embodiments of the memory device based on the configuration shown in FIG. 5.

FIG. 6 is a circuit diagram illustrating the detail of the configuration shown in FIG. 5.

This memory device shown is provided, as the same circuit components as those in the circuit shown in FIG. 3, with the RAM 40, the counter 50 for designating write and read addresses of the RAM 40 one by one per each clock pulse, the shift register 60 for setting an initial value n to the counter 50, the control circuit 70 for effecting control of the entirety of the circuit, and the selector 80, and it is provided with a selector 90 newly added in this embodiment.

The configuration and the operation of the RAM 40, the shift register 60, the control circuit 70 and the selector 80 have been previously described in connection with the embodiment shown in FIG. 3. Therefore, their explanation will be omitted and the configuration and the operation of the selector 90 will now be mainly referred to here.

The selector 90 comprises an AND gate 92 to which an update (UPDT) signal and an entire circuit input $D_{in}$ are input, an AND gate 91 to which a signal obtained by inverting the UPDT signal using an inverter 90 and an output of the selector 80 are input, and an OR gate 93 to which outputs from the two AND gates are input. An output of the OR gate 93 is input to an input $D_{in}$ of the RAM 40 and a D terminal of the shift register 60.

The operation of the memory device thus configured will be described with reference to a timing chart shown in FIG. 7.

First, the UPDT signal is set at H level to input store data into the shift register 60, i.e. data indicative of an initial number n. At this time, a SFTE signal of H level is input to the control circuit 60 to input 16 clock pulses so that the data indicative of the initial number is stored into the shift register 60. Thus, the initial number n is stored into the shift register 60 in a binary form. Accordingly, when an INIT signal of H level in input to the LOAD terminal of the counter 50, the initial number n is set to the counter 50. Then, when the INIT signal shifts to L level, the data indicative of the initial number n is maintained in the counter 50 as it is. The initialization is thus completed. Accordingly, when the INIT signal and the SFTE signal are respectively set at L level at time $t_0$, the initialized condition is maintained.

Figure 7:
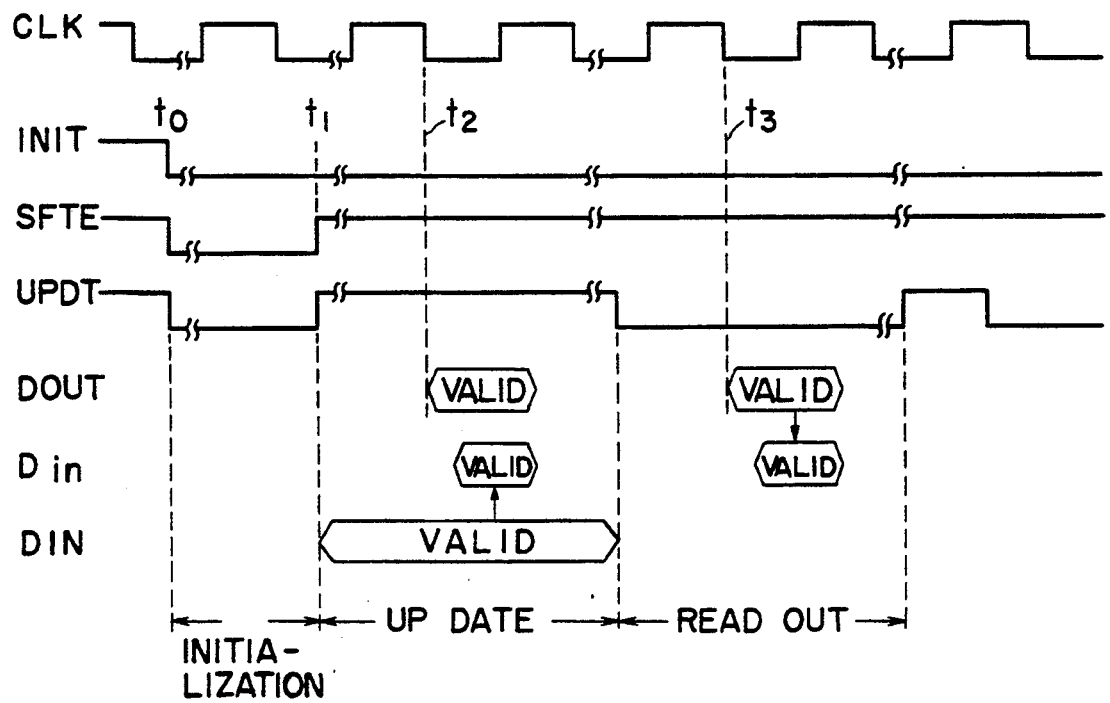
FIG. 7 is a timing chart showing the operation of the memory device shown in FIG. 6.

Then, for allowing this memory device to function as a device identical to ordinary shift registers, this memory device operates so as to output SFTE signal of H level from the control unit 70 and to output UPDT signal of H level from the selector 90 (time $t_1$ in FIG. 7). As a result, the DIN input becomes valid. In this embodiment, the RAM 40 effects the read modify write operation as previously described. Accordingly, the data read output $D_{out}$ becomes valid at the time of a falling of the CLK signal at time $t_2$ in FIG. 7, with the result that the write input $D_{in}$ becomes valid within a portion of the valid period of the data read output. Accordingly, when data of N bits to be stored as the $D_{in}$ signal is input, this N bit data is delivered to the $D_{in}$ input terminal of the RAM 40 via the AND gate 92 and the OR gate 93. At this time, since the SFTE signal is placed in H level, the CLK signal is input from the control circuit 70 to the CLK terminal of the counter 50 and the WE terminal of the RAM 40. Accordingly, data is written, bit by bit, into memory areas assigned to respective addresses of the RAM 40 corresponding to count values output from the counter 50. When the count value of the counter 50 is equal to zero, the count value represents n for a second time at timing of the next clock pulse. At this time, the contents stored in the RAM 40 are output as the data read output $D_{out}$ irrespective of the fact that any data is input as the DIN. Namely, for a time period during which a count value of the counter 50 circulates, data is fetched in order of storing data in the previous cycle. Thus, this memory device functions as an N (N=n+1) stage shift register which effects FIFO operation.

When data input to the DIN terminal at the time of reading is valid data, the content of the RAM 40 is replaced by this valid data and the valid data thus replaced is read in the next count cycle. In contrast, when the input data is invalid or null data, the content of the RAM 40 becomes invalid.

The operation for repeatedly reading the same data will now be described.

Initially, as previously described, the UPDT signal and the SFTE signal are set at H level to input valid data from the DIN terminal to store it into the RAM 40. When a count value of zero is reached, the UPDT signal is set at L level. Thus, an input to the AND gate 91 shifts to H level. As a result, the DOUT signal is input to the $D_{in}$ terminal. Accordingly, since the $D_{in}$ input becomes valid for a time period during which the DOUT output is valid as indicated by time $t_3$ in FIG. 7, it is possible to store the memory content of the RAM 40 into the RAM 40 for a second time. Thus, the same memory contents can be repeatedly fetched.

To realize such a memory device, it is sufficient to provide 8 pins for DIN, DOUT, CLK, SFTE, INIT, UPDT, power supply and ground. This memory device can be configured as e.g. a single-in-line package provided with lead wires for the above-mentioned terminals. In addition, this memory device has a circuit configuration such that a simple circuit e.g. a counter is only added to RAM. As a result, there is no possibility that an area for circuit components is increased, thus facilitating realization of integrated circuit.

Figure 3A:
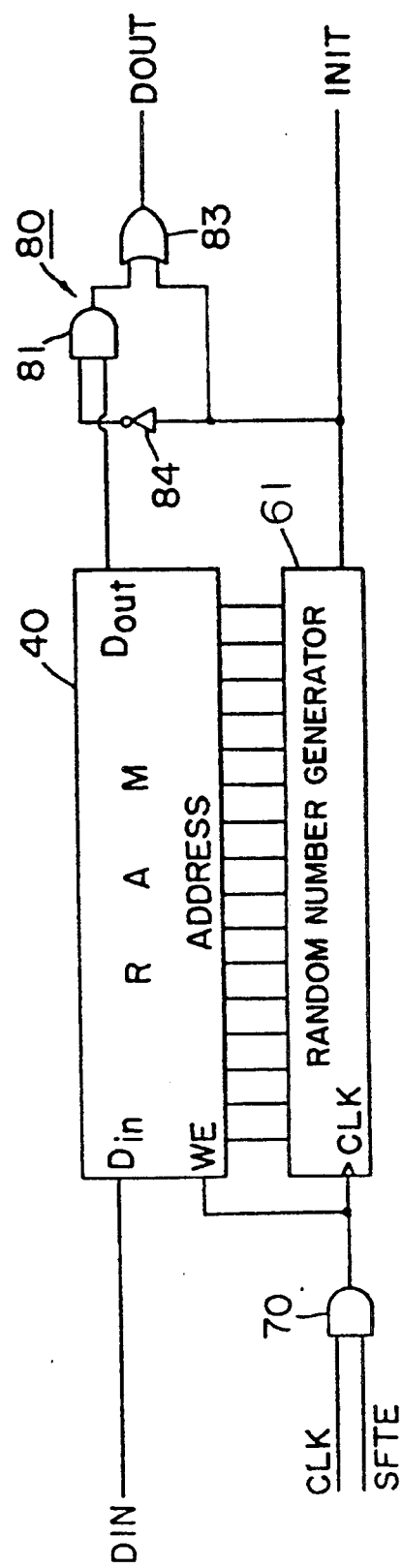
Figure 6A:
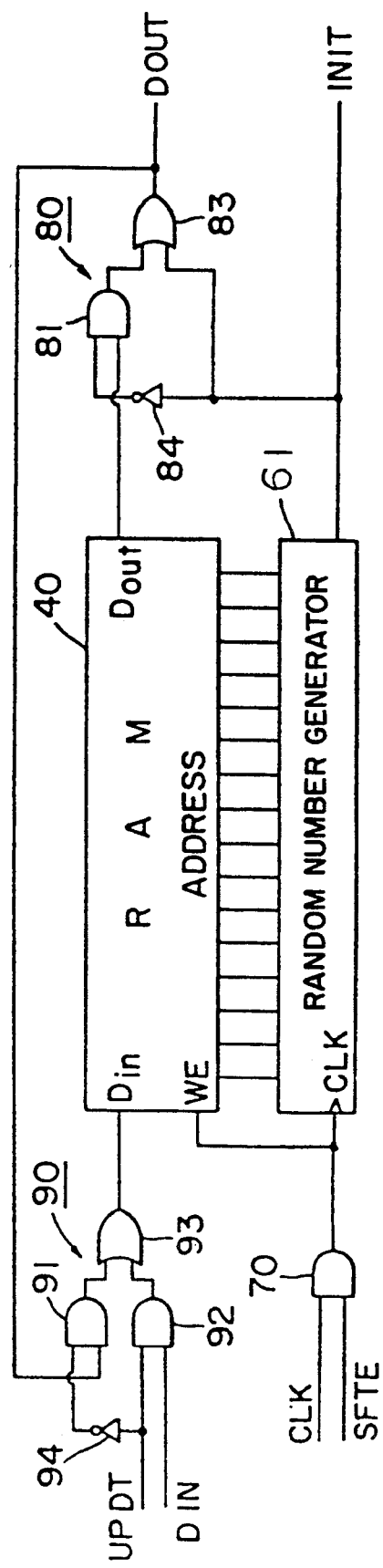

In the above-described embodiments, the counter which successively counts down one by one per each clock pulse is used for the addressing means. Instead, there may be employed a counter to successively count up one by one or a counter which does not necessarily output continuous values, but outputs discrete different values during each cycle. The essential requirement for the addressing means is to have a function as state transition means capable of designating non-used write or read addresses of memory means without repeatedly addressing the same value during each cycle. In view of this, e.g. a random number generator which does not generate the same number may be used. FIG. 3A and FIG. 6A show such variations which use a random number generator 61 instead of the shift register 60 in FIG. 3 and FIG. 6. When such a random number generator is employed, it is required to reconstruct read data on the basis of designated addresses.

Figure 3B:
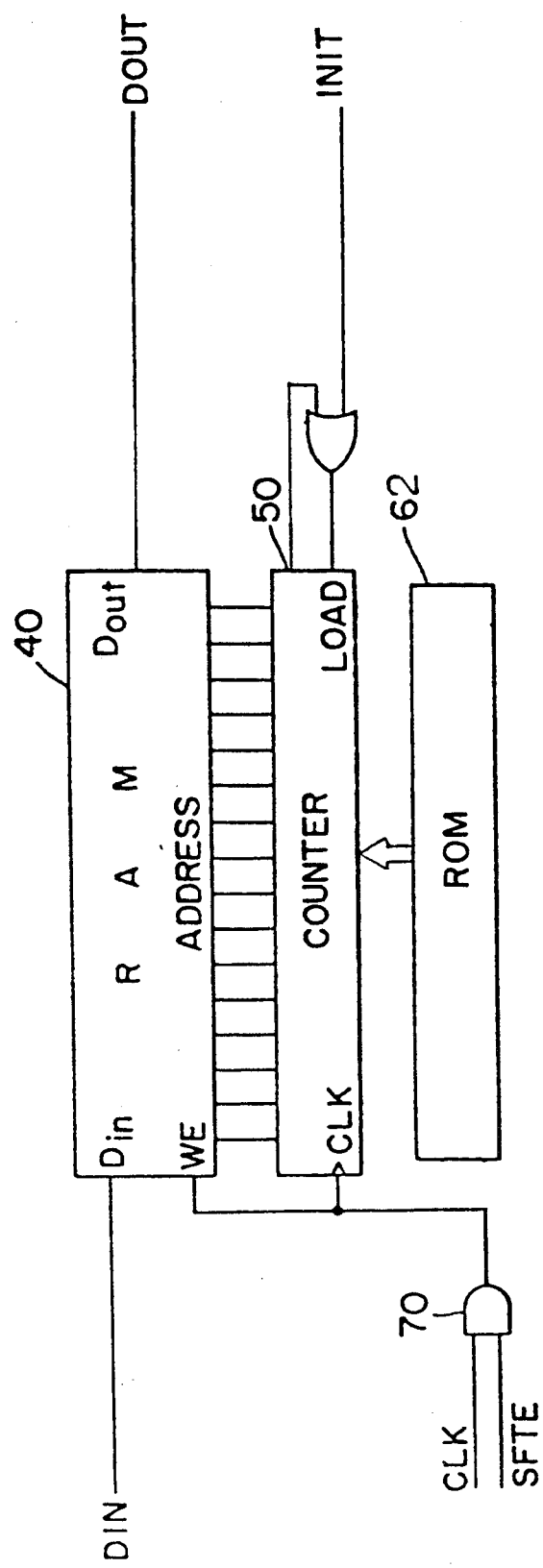
Figure 4A:
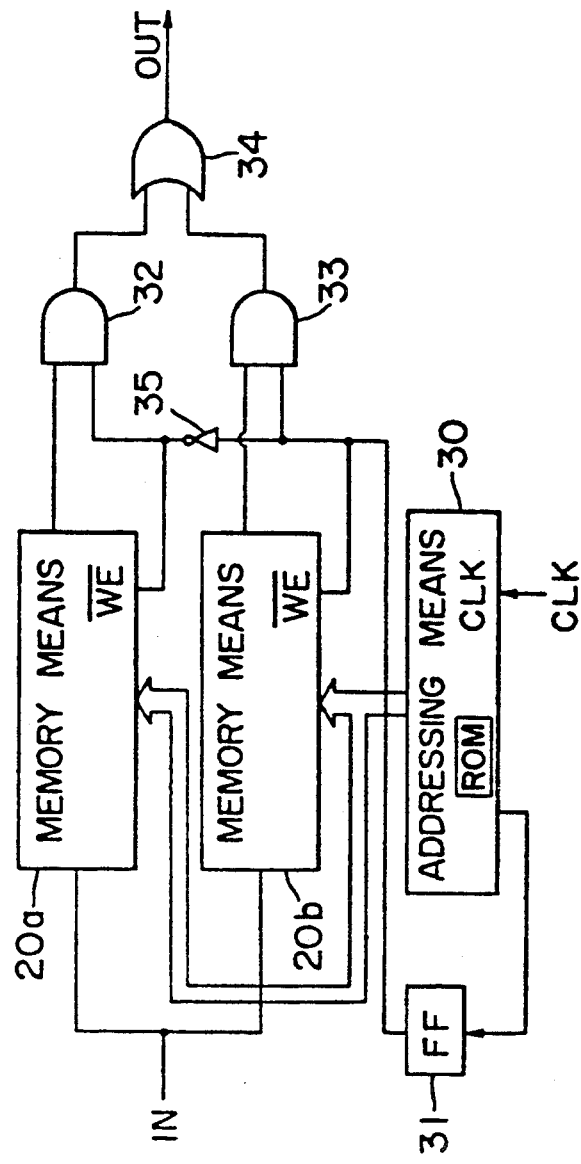
Figure 6B:
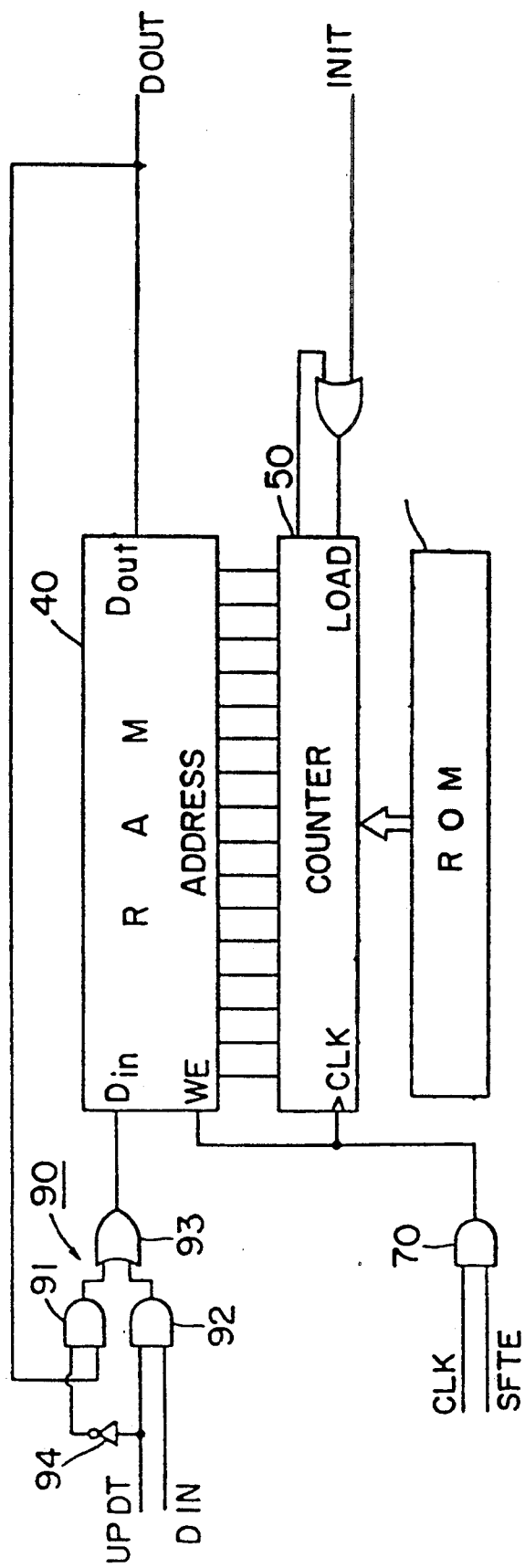

In the above-mentioned embodiment, the shift register is used to set the number of stages required for the counter. According to use, there are instances where there is no need to change the depth of the memory device. In these instances, the number of stages required for the counter operation may be set by ROM. FIG. 3B, FIG. 4A and FIG. 6B show such variation which use a read only memory 62 instead of the shift register 60 in FIG. 3, FIG. 4 and FIG. 6, respectively. In addition, the shift register employed in the above-mentioned embodiment is of the serial setting type, but shift registers of the parallel setting type may be used.

Further, by connecting a plurality of circuits each employed in the above-mentioned embodiments in series, i.e., by connecting DOUT terminal to DIN terminal of the next stage circuit, it is possible to provide a large number of stages as desired.

In the above-mentioned embodiment, the counter has the same operation mode at the time of writing of data as that at the time of reading of data. Accordingly, each memory device including such a counter functions as a FIFO memory. In addition to this, if addressing at the time of reading is carried out in order opposite to that at the time of writing, each memory device can be used as a FILO memory. For this purpose, a reversible shift register may be used for the shift register.

As described in detail, the memory device according to the present invention is provided with memory means capable of storing data into a memory area assigned to an address designated or reading it therefrom, and addressing means for designating address values different from each other during each cycle. Accordingly, by selecting the number of address values designated by the addressing means, it is possible to provide a memory device having an arbitrary number of stages which has a capacity less than that of the memory means.

Further, by employing the memory means capable of effecting read and write operations at the same time to deliver its output back to the input side thereof for a second time, it is possible to provide a memory device having an arbitrary number of stages which is capable of repeatedly outputting the same data.

In addition, by employing two memory means having the common data input and the common addressing input, and the flip-flop which inverts its state in response to the completion of addressing signal corresponding to one cycle having N clock pulses from the addressing means to input an output of the flip-flop to the write enable terminals of the two memory means so that logical states at the write enable terminals are opposite to each other, it is possible to provide a 2N memory device having an arbitrary number of stages.

What is claimed is:

1. A memory device comprising:
   a) addressing means for cyclically generating a predetermined number N of address signals in a fixed sequence during an operating cycle of said memory device and for repetitively generating the same fixed sequence of address signals during successive operating cycles;
   b) memory means for storing a plurality of bits, said memory means cyclically outputting data stored at different addresses corresponding to said fixed sequence of address signals, and at the same time, cyclically writing new data for a next cycle at the same addresses corresponding to said fixed sequence of address signals; and
   c) switch means operative in a first position for connecting an output of said memory means to an input of said memory means and in a second position for connecting said input of said memory means to an external data source,
   wherein said memory device is operative with said switch means in said first position for repetitively circulating the same data through said memory means at said different addresses corresponding to said fixed sequence of address signals,
   and said memory device is operative with said switch means in said second position for passing data only from said external data source through said memory means at said different addresses corresponding to said fixed sequence of address signals and to said output of said memory means,
   said addressing means having a presettable counter which holds an initial value indicative of said predetermined number N of address signals generated by said addressing means and outputting the value successively changing the value by one, and
   wherein said presettable counter is connected to a shift register which stores said initial value of the presettable counter.

2. A memory device as set forth in claim 1, wherein said switch means comprises a gate circuit which operates in response to a switching signal.

3. A memory device comprising:
   a) addressing means for cyclically generating a predetermined number N of address signals in a fixed sequence during an operating cycle of said memory device and for repetitively generating the same fixed sequence of address signals during successive operating cycles;
   b) memory means for storing a plurality of bits, said memory means cyclically outputting data stored at different addresses corresponding to said fixed sequence of address signals, and at the same time, cyclically writing new data for a next cycle at the same addresses corresponding to said fixed sequence of address signals; and
   c) switch means operative in a first position for connecting an output of said memory means to an input of said memory means and in a second position for connecting said input of said memory means to an external data source, wherein said memory device is operative with said switch means in said first position for repetitively circulating the same data through said memory means at said different addresses corresponding to said fixed sequence of address signals, said memory device is operative with said switch means in said second position for passing data only from said external data source through said memory means at said different addresses corresponding to said fixed sequence of address signals and to said output of said memory means, said addressing means having a presettable counter which holds an initial value indicative of said predetermined number N of address signals generated by said addressing means and outputting the value successively changing the value by one, and wherein said presettable counter is connected to a read only memory device which stores said initial value of the presettable counter.

4. A memory device as set forth in claim 3, wherein said switch means comprises a gate circuit which operates in response to a switching signal.

5. A memory device comprising:

a) addressing means for cyclically generating a predetermined number N of address signals in a fixed sequence during an operating cycle of said memory device and for repetitively generating the same fixed sequence of address signals during successive operating cycles;

b) memory means for storing a plurality of bits, said memory means cyclically outputting data stored at different addresses corresponding to said fixed sequence of address signals, and at the time, cyclically writing new data for a next cycle at the same addresses corresponding to said fixed sequence of address signals; and c) switch means operative in a first position for connecting an output of said memory means to an input of said memory means and in a second position for connecting said input of said memory means to an external data source, wherein said memory device is operative with said switch means in said first position for repetitively circulating the same data through said memory means at said different addresses corresponding to said fixed sequence of address signals, said memory device is operative with said switch means in said second position for passing data only from said external data source through said memory means at aid different addresses corresponding to said fixed sequence of address signals and to sand output of said memory means, said addressing means having a random number generator circuit which outputs randomly arranged different values in said fixed sequence.

6. A memory device as set forth in claim 5, wherein said switch means comprises a gate circuit which operates in response to a switching signal.

* * * * *